United States Patent [19]
Bakshi et al.

[11] Patent Number: 5,978,893
[45] Date of Patent: Nov. 2, 1999

[54] METHOD AND SYSTEM FOR MEMORY MANAGEMENT

[75] Inventors: Chirag C. Bakshi; Chien C. Chou, both of San Jose, Calif.

[73] Assignee: Apple Computer, Inc., Cupertino, Calif.

[21] Appl. No.: 08/665,811

[22] Filed: Jun. 19, 1996

[51] Int. Cl.$^6$ ........................................... G11C 8/00
[52] U.S. Cl. .................. 711/171; 711/173; 711/147; 711/153; 365/230.03
[58] Field of Search .............................. 395/497.03, 463, 395/497.02, 221, 133, 427, 497.01, 143, 135, 622; 711/172, 136, 171, 100, 170; 365/221

[56] References Cited

U.S. PATENT DOCUMENTS

| | | | |
|---|---|---|---|
| 4,315,312 | 2/1982 | Schmidt | 395/497.03 |
| 4,509,119 | 4/1985 | Gumaer et al. | 395/463 |
| 5,109,336 | 4/1992 | Guenther et al. | 395/497.02 |
| 5,359,568 | 10/1994 | Livay et al. | 365/221 |
| 5,500,928 | 3/1996 | Cook et al. | 395/133 |
| 5,559,980 | 9/1996 | Connors et al. | 395/427 |
| 5,561,785 | 10/1996 | Blandy et al. | 395/497.01 |
| 5,561,786 | 10/1996 | Morse | 395/497.01 |
| 5,592,601 | 1/1997 | Kelley et al. | 395/143 |
| 5,600,768 | 2/1997 | Andresen | 395/135 |
| 5,623,654 | 4/1997 | Peterman | 395/622 |

*Primary Examiner*—John W. Cabeca
*Assistant Examiner*—Fred F. Tzeng
*Attorney, Agent, or Firm*—Burns, Doane, Swecker & Mathis

[57] ABSTRACT

A method and a system are provided for managing fixed size memory blocks in a graphic imaging system. A system memory includes at least one queue containing a linked list of fixed size memory blocks and a page pool of variable size memory blocks. A system memory manager allocates memory blocks from the system memory in response to requests. Upon a request for a memory block of a particular fixed size, the system memory manager allocates a memory block of the fixed size from a queue containing memory blocks of the fixed size if the queue has memory blocks available. If the queue does not have memory blocks available, the system memory manager creates an extension to the queue containing memory blocks of the fixed size. The extension is created from a page pool. The extension is linked to the queue, and a memory block of the fixed size is then allocated from the queue. If the page pool does not contain adequate memory to create an extension, the portion of the page which has been reduced to display list entries is rendered, and all of the allocated memory blocks are deallocated. Then, a memory block of the fixed size is allocated from the queue.

23 Claims, 5 Drawing Sheets

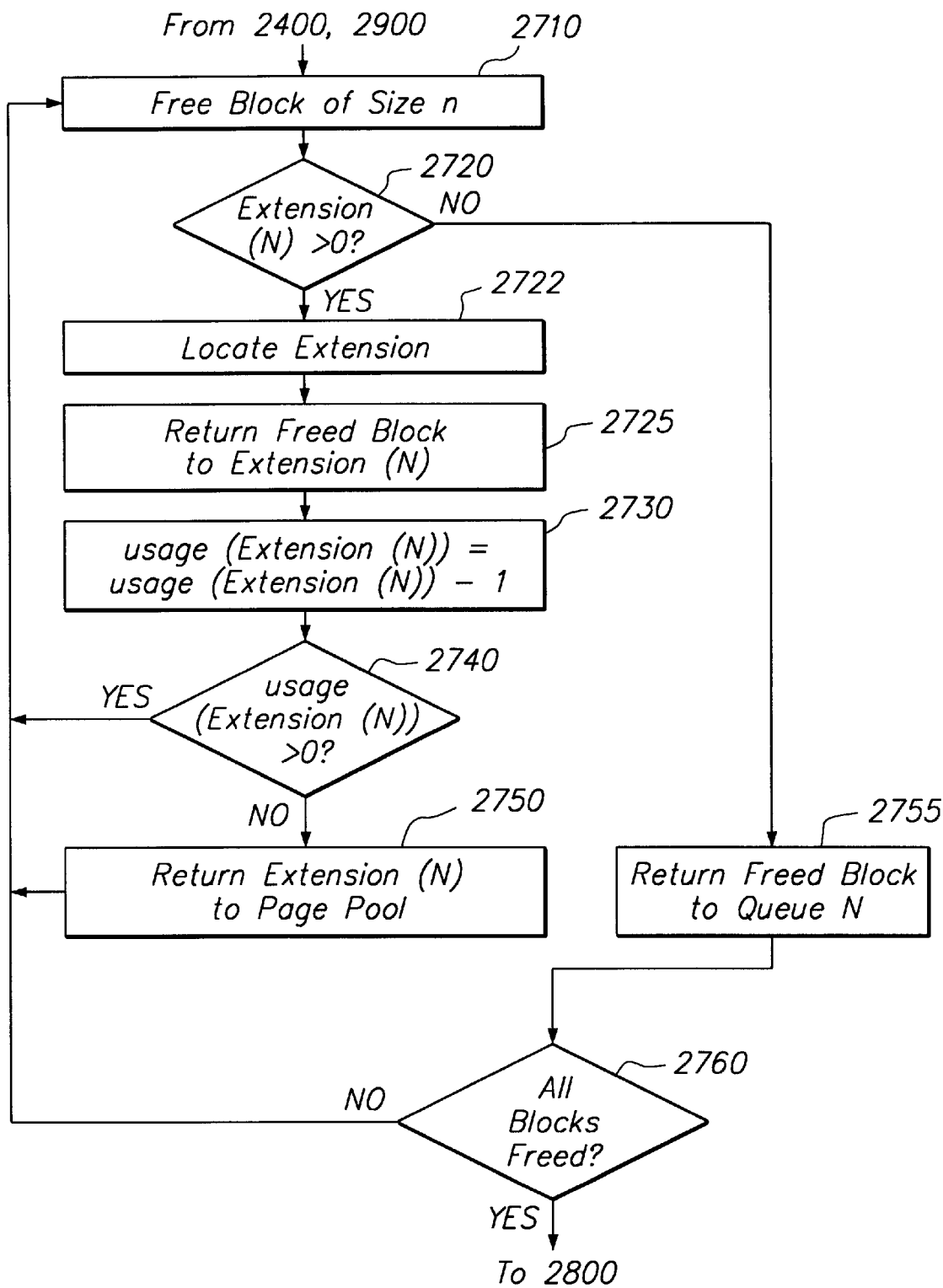

METHOD AND SYSTEM FOR MEMORY MANAGEMENT

This invention relates to a method and a system for managing fixed size memory blocks in a system memory. More particularly, this invention relates to a method and a system for allocating and deallocating fixed size memory blocks in a system memory in a graphic imaging system for processing data.

BACKGROUND

Efficient memory management is essential to the performance of complex data processing systems such as graphic imaging systems which require memory allocation for different purposes. In a graphic imaging system, such as a laser printer, data which describes an image is generated, for example, by means of a desktop publishing program. A host computer converts the image data into commands that can be used by the printer. The printer interprets these commands as descriptions of the types of graphics operations to be performed, such as draw a rectangle or draw a particular character of text. The printer also determines the associated graphic state arguments that apply to each object, such as color, font, size, and the like. The interpreted data is stored in a display list.

The printer converts the entries in the display list into data that may be used by the print engine. The display list entries are converted into pixel display values which are stored in a frame buffer to represent the shapes and colors of the objects. The values in the frame buffer are used to control the operation of the active elements in a print engine, such as a laser diode in a laser printer or a print head in an inkjet printer, to form the image. The process of converting the entries in the display list into frame buffer representations is known as rendering.

The amount of memory required to store the display list representations for a page can vary, depending on the size and complexity of the image to be printed. For example, if a page of text contains characters having an extremely small font size with minimal spacing between them, a large number of characters can appear on a single page. Each character represents a different object that forms an entry on the display list. There is no limit on the number of objects that constitute an image, thus there is no bound on the amount of memory required to hold a complete display list for a page.

To accommodate the storage needs for display list representations of images of varying complexity and size, sufficient memory must be available, in addition to memory required by the printer for other needs. While large blocks of memory could be set aside for storing display lists, this would result in an inefficient use of memory, since display lists are typically small and only occasionally require large amounts of memory. To ensure efficient use of memory, a minimum amount of memory should be set aside for storing display list entries, and an additional memory should be provided that may be dynamically allocated for storing the display list entries as needed.

Many types of dynamic memory allocation systems have been developed for various applications. In some applications, the blocks of memory that are needed for storage are of a fixed size or one of a plurality of fixed sizes. In other applications, the required block size may be variable and impossible to predict ahead of time.

For applications using fixed size blocks, blocks are typically marked as allocated in a bit map. A running pointer or index identifies the next available block in the bit map. When a block is requested, the pointer or index is updated by executing a search algorithm to search for the next available block. Bit maps are typically large, containing thousands of memory blocks. Thus, searching for a storage block in the bit map is slow and inefficient.

As an alternative to searching bit maps, linked lists have been used for linking available free memory from one block to the next block. Various algorithms are used for determining which block to allocate to meet a storage request. A "garbage collection" process is used to collect allocated memory blocks that are no longer in use and return them to the free memory list. Traditionally, linked lists have been used only for memory allocation of variable size blocks.

A technique has been proposed to use fixed size queues, each of which contains memory blocks of a particular size, in combination with a linked list of storage blocks. According to this technique, when a request for a memory block of a particular size is made, the first memory block in the queue of blocks of that particular size is allocated. The fixed size queues allow the processor to immediately find blocks of a given size without requiring a search. If the request cannot be satisfied from the queue, a search is then made of the linked list of available storage blocks. Periodically, garbage collection of all the free storage blocks present in the fixed size queues is performed, the free storage blocks are returned to the linked list of available blocks, and the fixed size queues are recreated. This periodic garbage collection requires a halt in the processing while the fixed size queues are scanned for unused blocks and recreated.

Yet another approach is described in U.S. Pat. No. 5,109,336 to Guenther et al. This approach involves combining queues of fixed size blocks and a global list of blocks of variable sizes. According to this approach, when a request cannot be satisfied from the fixed size queues, memory blocks may be allocated from a global storage containing a linked list of blocks. Pointers to available blocks in the global storage are employed, to help in searching for blocks of a particular size if the request cannot be satisfied from the queues. Continuous garbage collection is implemented to continually purge unused storage blocks from the fixed size queues. For each queue, a spill address is calculated, which determines the minimum number of blocks that are needed in the queue. The unneeded blocks are returned to the global storage. If the global storage list is not adequate, additional blocks may be obtained from an extended storage. The additional blocks are added to the global storage and are searched in the same manner as the global storage. This approach allegedly reduces the processing time required for memory allocation. However, searching for blocks in the global storage still consumes valuable processor time. Also, as the variable size blocks are allocated from various places throughout the global storage, fragmentation of the global storage results, which inhibits system performance.

For a graphic imaging system such as a printer, the more time consumed to allocate memory, the slower the printing will be. While the conventional dynamic memory allocation systems may be adequate for some applications, they consume excessive processing time and are not adequate for a graphic imaging system. Thus, there is a need for a dynamic memory allocation system that efficiently allocates memory.

SUMMARY

It is an object of the present invention to dynamically allocate and deallocate memory blocks in a graphic imaging system while minimizing processor time and avoiding fragmentation. According to the present invention, this object is achieved by a system and a method for managing fixed size memory blocks. A system memory includes at least one queue containing a linked list of fixed size memory blocks and a page pool of variable size memory blocks. A system memory manager allocates memory blocks from the system memory in response to requests. Upon a request for a memory block of a particular fixed size, the system memory manager allocates a memory block of the fixed size from a queue containing memory blocks of the fixed size if the queue has memory blocks available. If the queue does not have memory blocks available, the system memory manager creates an extension to the queue containing memory blocks of the fixed size. The extension is created from a page pool. The extension is linked to the queue, and a memory block of the fixed size is then allocated from the queue. If the page pool does not contain adequate memory to create an extension, the portion of the page which has been reduced to display list entries is rendered, and all of the allocated memory blocks are deallocated. Then, a memory block of the fixed size is allocated from the queue.

BRIEF DESCRIPTION OF THE DRAWINGS

The present invention will now be described in more detail with reference to preferred embodiments of the system and method, given only by way of example, and with reference to the accompanying drawings, in which:

FIGS. 2a–2e illustrate a method for allocating and deallocating system memory blocks according to the present invention.

DETAILED DESCRIPTION

According to the present invention, a method and a system are provided for dynamically allocating and deallocating fixed size memory blocks for processing data in a data processing system. To facilitate an understanding of the present invention, it is described hereinafter in the context of a specific exemplary embodiment. In particular, reference is made to the implementation of the invention in a laser printer. It will be appreciated, however, that the practical applications of the invention are not limited to this particular embodiment. Rather, the invention can be employed in other types of data processing systems, such as those which pass data to and from CRT monitors and LCD display screens.

Figure 1:
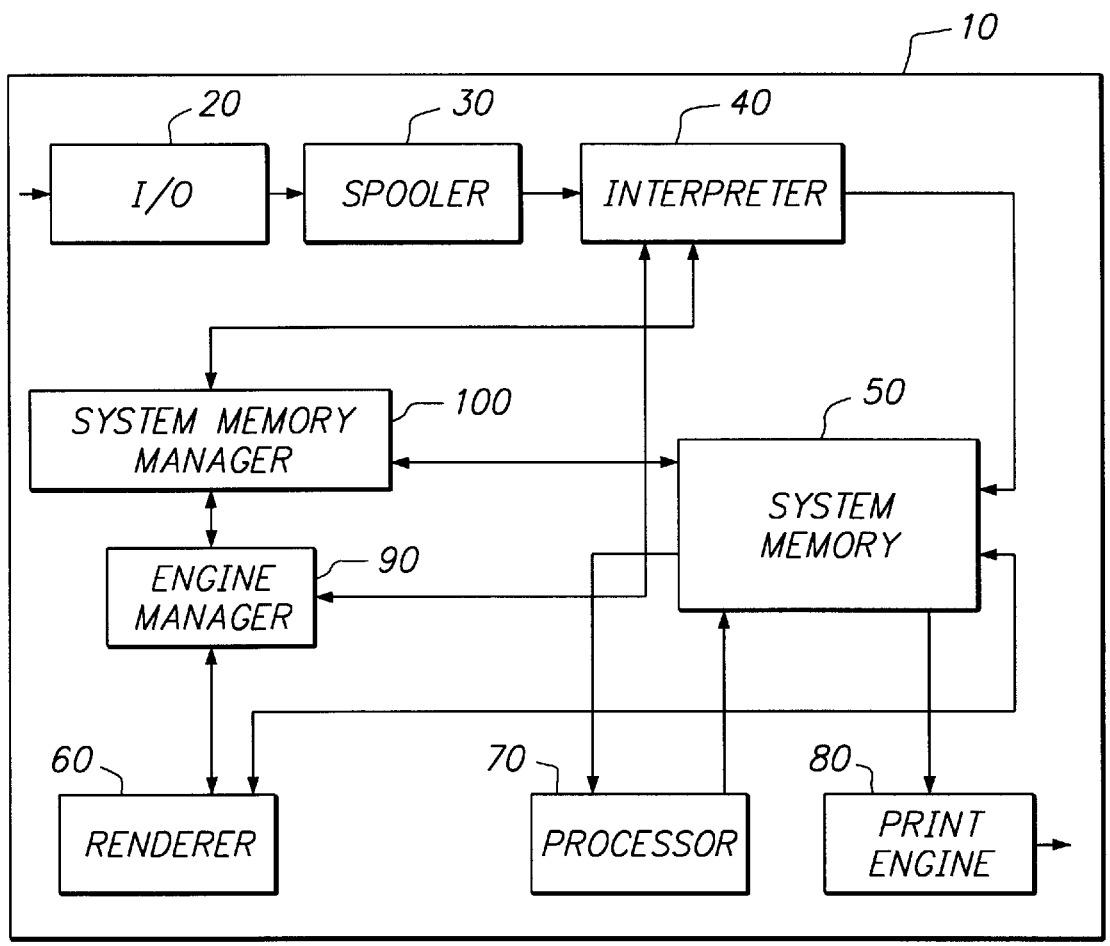
FIG. 1 illustrates a block diagram of the main subsystems which make up a printer of the type in which the present invention may be employed.

FIG. 1 is a block diagram of the major components of a laser printer of a type in which the present invention can be implemented. Referring thereto, the printer 10 includes an I/O controller 20 that is connected to one or more I/O ports for communication with computers and other external sources of data to be printed. A spooler 30 accumulates image data received from the external sources and stores the data until it is ready to be processed for printing. It will be appreciated, of course, that the spooler is optional and can be incorporated in an external device, rather than in the printer itself. An interpreter 40 receives the image data and issues calls which cause the desired image to be drawn, or printed, on the paper. The calls are stored in an intermediate form in a display list in memory allocated from the system memory 50. The information on the display list is provided to a renderer 60. The renderer converts the object-based information on the display list into individual pixel values in a bit map, which are stored in an uncompressed frame buffer allocated from the system memory 50, then compressed in the processor 70. The compressed pixel values are stored in a compressed frame buffer allocated from the system memory 50. Ultimately, the pixel values are supplied to a print engine. Under the management of the engine manager 90, the print engine controls the actual printing of the desired image.

A system memory manager 100 allocates memory blocks from the system memory 50 for the various purposes described above, including storing display list entries and frame buffer entries. The system memory 50 includes queues, each containing a linked list of fixed size blocks, and a page pool of memory, containing variable size blocks, which may be allocated for storing display list entries. The system memory manager 100 allocates blocks from the linked lists and the page pool for storing the display list entries in response to requests from the interpreter 40. Blocks of different sizes are allocated depending on the size and/or detail of the objects to be printed. The system memory also contains memory blocks reserved for other purposes, such as storing frame buffer representations, spooling and processing.

Figure 2A:
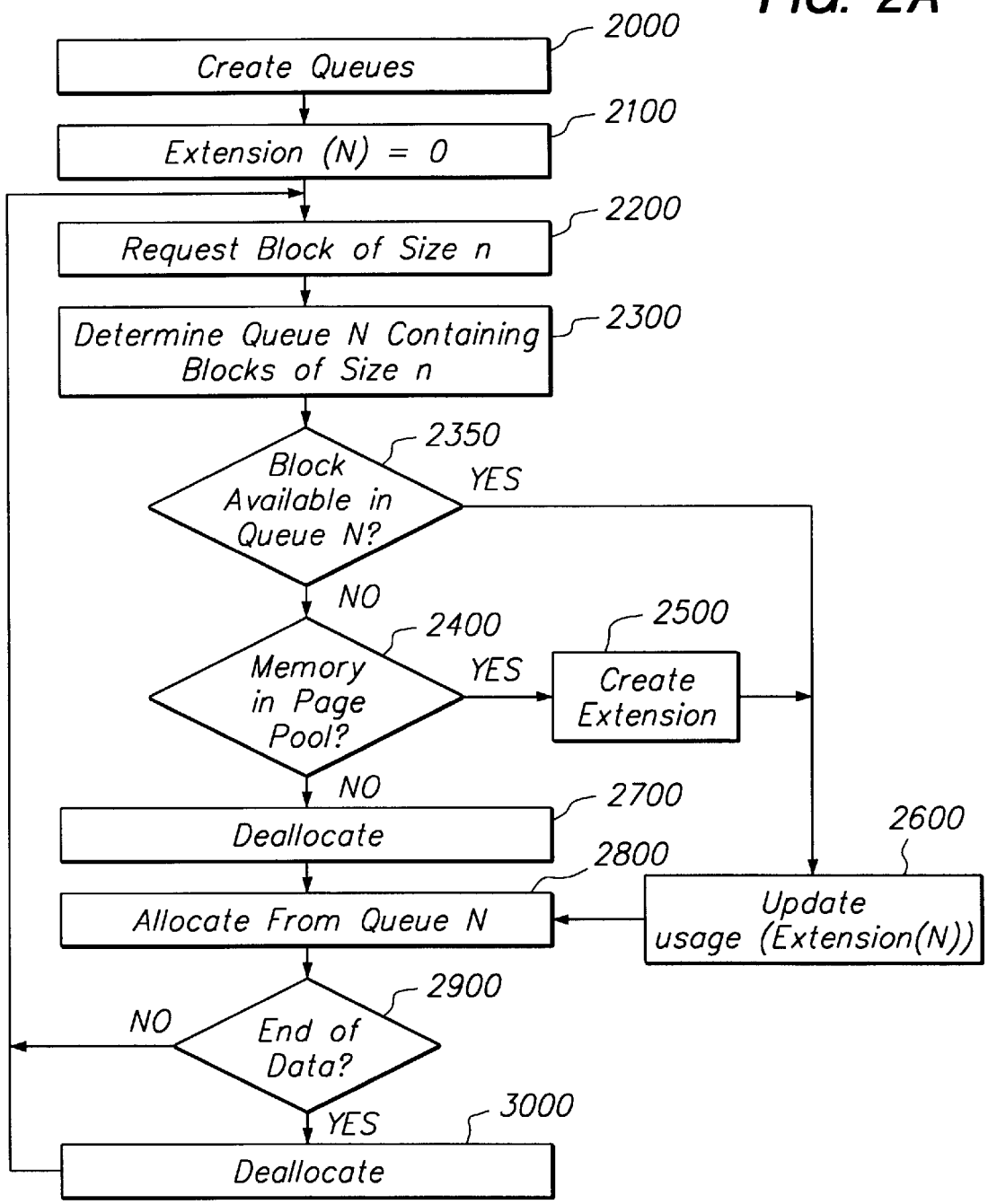

FIG. 2a illustrates a method for dynamically allocating and deallocating system memory according to the present invention. Referring to FIG. 2a, queues are created from the system memory at step 2000. This step occurs, for example, when the printer is initially turned on or reset. Each queue contains a linked list of fixed size blocks of the same size. The size and/or number of blocks in the queues may be determined according to the anticipated needs for storage. For example, the queues may be created to accommodate the average number, size and detail of objects that are contained on a typical page to be printed.

Once the queues are created, all the memory blocks in the queues and the page pool of the system memory are available to be allocated for storing display list entries. At step 2100, a parameter "Extension (N)" representing a number of extensions created for a queue N, where N represents the number of the queue, is set equal to zero for all the queues.

At step 2200, a request from, for example, the interpreter 40, for a memory block of a particular fixed size n is received by the system memory manager 100 for storing a display list entry. At step 2300, the system memory manager determines which queue contains the blocks of the particular fixed size. The queue that contains the block of the particular fixed size is recognized as queue N. At step 2350, the system memory manager determines whether queue N has a block available. If queue N does not have a block available, the process proceeds to step 2400.

At step 2400, the system memory manager determines whether there is memory available in the page pool. The page pool is used to fulfill requests from the interpreter and other clients in the printer. Ideally, the size of the page pool is adequate to handle requests from the interpreter for storing display representations of page images with a large number of objects and detail, so that a partial page does not have to be rendered. If the page pool is exhausted before an entire page has been stored as display list representations, the portion of the page that has been stored as display list representations is rendered, creating some performance penalties. Specifically, the portion of the page that is rendered is compressed, then stored in a compressed frame buffer. When the rest of the page is finally rendered, the previously compressed portion is decompressed and added to the remaining page portion. Then, the whole page is compressed and finally stored. This compressing and decompressing consumes valuable processor time. To avoid this consumption of processing time, the size of the page pool is ideally selected to be large enough to store display representations of an entire page containing images with a large number of objects and detail. In addition, because the interpreter is not the only client that uses the page pool, the page pool is preferably selected to be large enough to serve the needs of other clients, such as the renderer. In practice, the page pool is selected to be large enough to accommodate at least an average page, e.g., 2 Megabytes, as well as the needs of other clients.

If there is memory available in the page pool, an extension for queue N is created at step 2500, making memory available to be allocated from the queue. The parameter "Extension (N)" is updated by adding one to indicate that a new extension has been created for queue N. This step is described in more detail below with respect to FIG. 2b.

From either step 2350 or step 2500, the process proceeds to step 2600, at which a parameter "usage (Extension (N))", indicating the number of blocks that have been allocated from Extension (N), is updated. If no extension has been created for the queue, no updating occurs. From step 2600, the process moves to step 2800, at which a block of the requested fixed size is allocated from the queue N. Preferably, a block from the head of the queue N is allocated first, which eliminates the need for searching to locate a block to be allocated.

If, at step 2400, the system memory manager determines that there is insufficient memory available in the page pool to create an extension, the process moves to step 2700, at which the display list entries are rendered from the allocated memory blocks, and the allocated memory blocks are deallocated. Once all the memory is deallocated, the memory blocks are available again for allocation. The process then proceeds to step 2800, and a block is allocated from the queue N.

After a block of the requested size is allocated, the process proceeds to step 2900, where it is determined if the end of the data to be processed for printing has been reached, for example at the end of a page. If the end of the data to be processed has not been reached, the process returns to step 2200. If the end of the data to be processed has been reached, the process proceeds to step 3000, where the page is rendered, and all the allocated memory blocks are deallocated. Then, the process returns to step 2200.

According to the present invention, the steps of deallocating, 2700 and 3000, are performed at "sync points" that occur normally in a laser printer. That is, the points at which the page pool is exhausted and at which the end of the page has been reached are recognized by the printer as points at which the display list entries are to be rendered from the memory blocks. The present invention takes advantage of processes occurring normally in a laser printer to dynamically free memory blocks without requiring a halt in the processing to return unused memory blocks to the page pool. Thus, according to the present invention, no more processing time is consumed by returning the unused allocated memory blocks to the system memory than would be required by the laser printer for rendering display list entries.

Figure 2B:
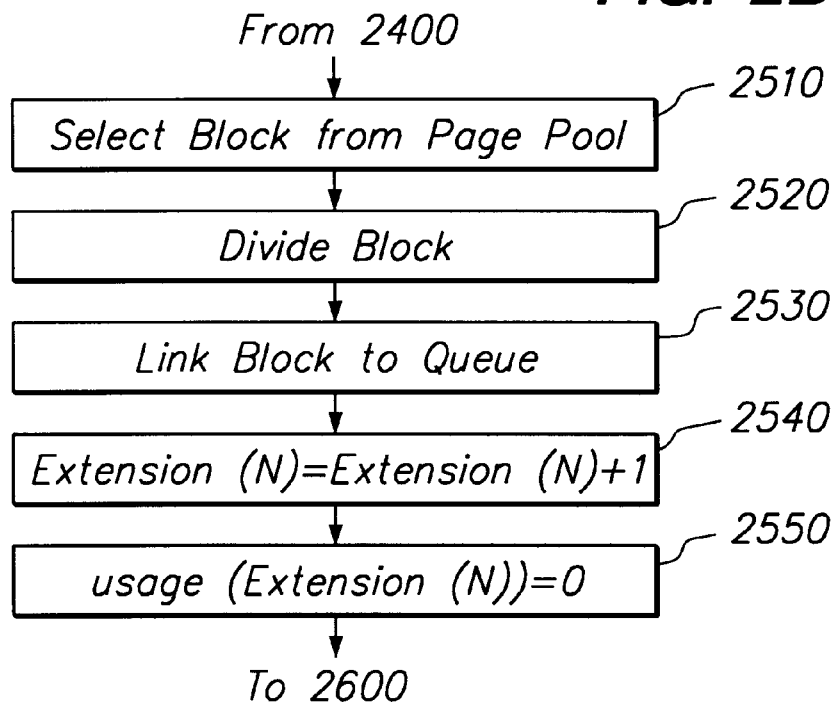

FIG. 2b illustrates in detail the step of creating an extension, i.e., step 2500. Referring to FIG. 2b, first a block of memory is selected from the page pool at step 2510. The size of the block of memory that is selected from the page pool is user programmable, and can be determined at the time the queues are created. Ideally, the block selected from the page pool will be significantly larger than the fixed size block of the queue for which the extension is to be created so that the number of extensions that will need to be created is minimized. For example, for a queue containing blocks of 16 bytes, a 4 kilobyte block may be selected from the page pool to create an extension. The fewer the extensions, the less time will be consumed upon deallocating in determining which extension a block of freed memory belongs to.

The selected block of memory is divided into a number of blocks the same size as the fixed size blocks in step 2520. Next, at step 2530 the divided memory block is linked to the queue, creating an extension to the queue. At step 2540, the parameter "Extension (N)" is updated to indicate that a new extension has been created for the queue. Finally, at step 2550, the parameter "usage (Extension (N))" is set to 0 for the new extension to indicate that all the memory blocks in the extension are available.

Figure 2C:
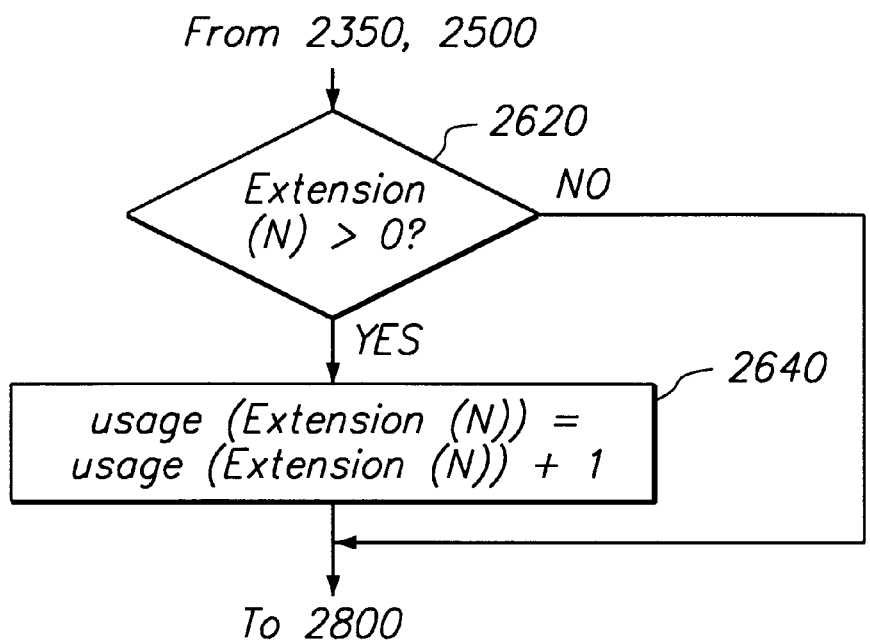

FIG. 2c illustrates in detail the step of updating the usage count, i.e., step 2600. Referring to FIG. 2c, it is first determined at step 2620 whether there is an extension for which a usage count must be updated by determining whether the parameter "Extension (N)" is greater than 0. If the parameter "Extension (N)" is greater than 0, the parameter "usage (Extension (N))" is updated by adding one at step 2640. If the parameter "Extension (N)" is not greater than 0, this indicates that no extension has been created for queue N, and no updating occurs.

FIG. 2d illustrates in detail the steps of deallocating, i.e., steps 2700 and 3000. As shown in FIG. 2d, a block of memory of size n is freed at step 2710. The blocks may, for example, be freed sequentially, with the last block allocated being deallocated first. At step 2720, it is determined whether the parameter "Extension (N)" is greater than zero. If the parameter "Extension (N)" is greater than zero, this indicates that the freed block was allocated from an extension, since extension blocks are allocated after queue blocks. The flow then moves to block 2722, where the extension from which the block was allocated is located. If the blocks have been allocated and freed sequentially, no searching is required to locate the extension that the freed block belongs to. The extension from which a freed block of size n was allocated is simply determined to be the most recently created extension that is still linked to the queue N containing blocks of size n. Alternatively, a table in the system memory manager may be used to determine which extension a freed block belongs to.

After the extension from which the block was allocated is located, the process proceeds to step 2725, at which the freed block is returned to the appropriate extension, referred to here as Extension N. The process then moves to step 2730, at which the parameter "usage (Extension (N))" is updated by subtracting one, indicating that one allocated block has been returned to the extension. At step 2740, it is determined whether the parameter "usage (Extension (N))" is greater than zero. If the parameter "usage (Extension (N))" is not greater than zero, this indicates that the memory blocks in this extension have all been deallocated, and the process goes to step 2750, at which the extension is returned to the pool, and the parameter "Extension (N)" is decremented by one. The process then returns to step 2710. If at step 2740, the parameter "usage (Extension (N))" is determined to be greater than zero, this indicates that some blocks in the extension are still in use, and the process returns to step 2710.

If the result of decision block 2720 is "No", this indicates that the freed block was not allocated from an extension, and the flow proceeds to block 2755. At block 2755, the freed block is returned to the top of the respective queue N, i.e. the queue containing blocks of size n. This eliminates the need for searching for a block upon the next request for allocation. The block may be simply allocated from the top of the queue.

At step 2760, it is determined whether all the blocks have been freed. If so, the deallocating step ends. If not, the deallocating step starts over at step 2710. The deallocation is performed repeatedly until all the blocks have been freed.

Figure 2E:
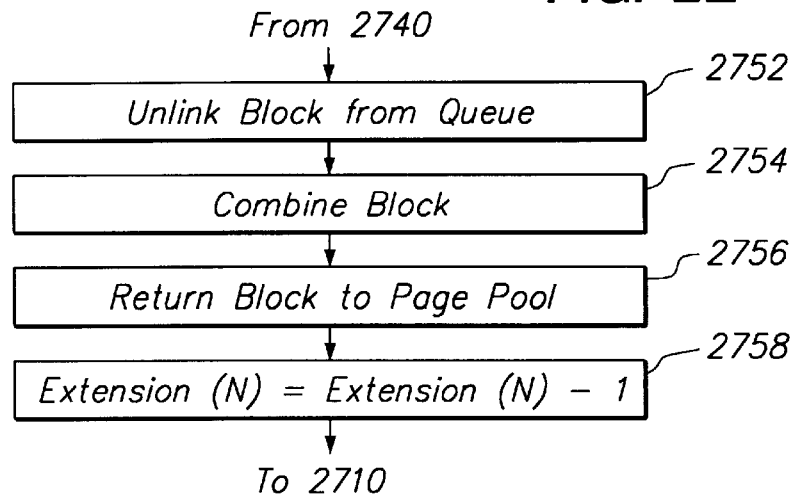

FIG. 2e illustrates in detail the step of returning an extension to the page pool. In step 2752, the extension is unlinked from the queue. At step 2754, the divided blocks of the fixed size are combined into one block. At step 2756, the combined block is returned to the page pool. Finally, at step 2758, the parameter "Extension (N)" is updated by subtracting one to indicate that one less extension is in use for queue N.

Figure 3:
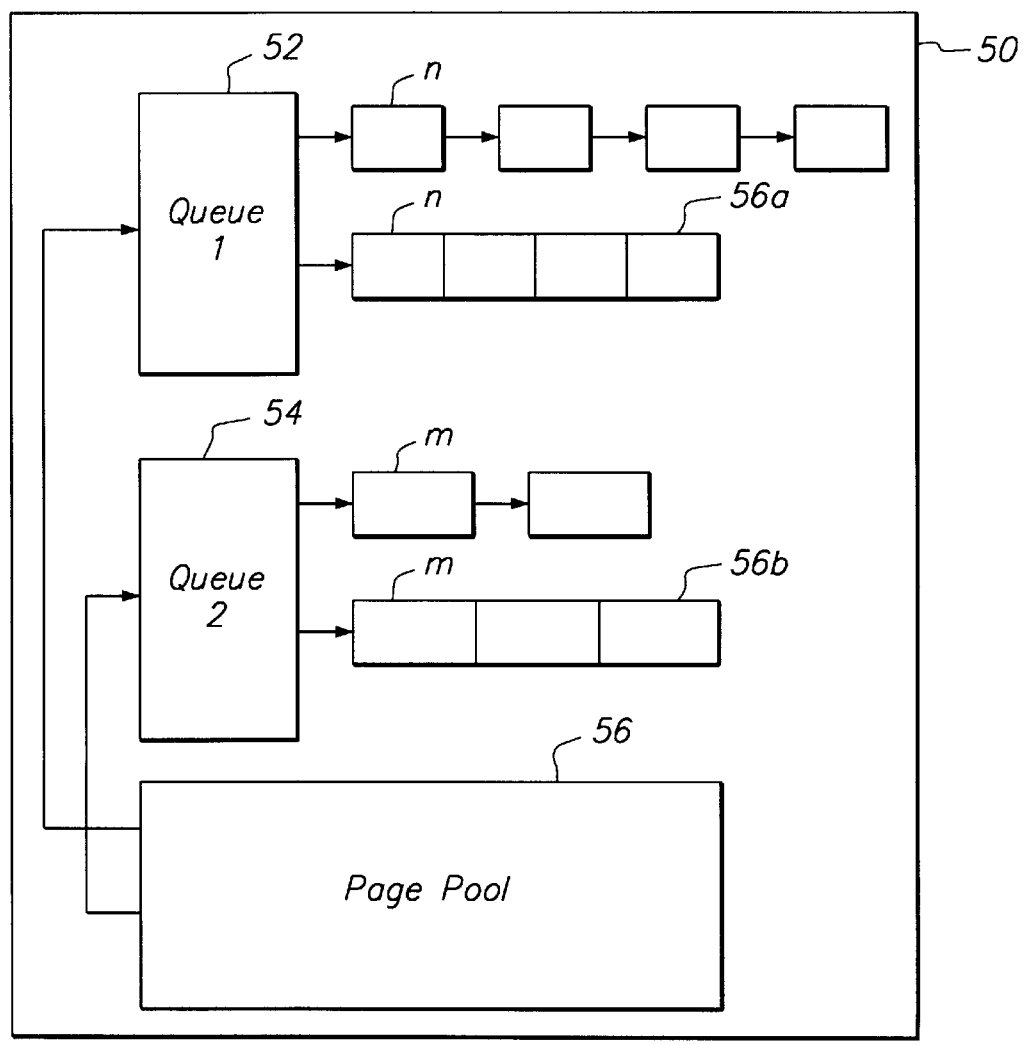
FIG. 3 depicts the flow of allocation of memory blocks in a system memory according to the present invention.

FIG. 3 illustrates the flow of memory allocation in a system memory according to an exemplary embodiment of the present invention. Referring to FIG. 3, the system memory 50 includes queues 52 and 54 containing fixed size blocks of "n" bytes and "m" bytes, respectively. While only two queues, Queue 1 and Queue 2, are shown for illustrative purposes, the system memory may contain any number of queues. The system memory 50 also includes a page pool 56 of variable size blocks from which extensions may be created.

As shown in FIG. 3, when fixed size blocks in queue 52 and in queue 54 have all been allocated, extensions 56a and 56b are created from the page pool 56 and linked to the queues 52 and 54, respectively. The system memory manager searches the page pool until a block of the desired size is located, then the block is divided and added to the queue. As shown in FIG. 3, the extensions 56a and 56b are divided into memory blocks of "n" bytes and "m" bytes, respectively, and linked to the queues 52 and 54. Blocks from the extensions 56a and 56b are then available for allocating.

Extensions are added as needed as long as memory remains in the page pool. When the page pool has been exhausted or when the end of the data to be processed has been reached, the display list entries stored in the allocated blocks are rendered all at once, and the blocks are returned to the queues.

While the present invention has been described and illustrated for dynamically allocating and deallocating memory blocks for storing display list entries in a laser printer, it should be understood that the invention is not limited thereto. The present invention may be employed in an any type of data processing system for dynamically allocating and deallocating memory. The invention further contemplates any and all modifications that fall within the spirit and scope of the invention as defined by the following claims.

What is claimed is:

1. A method of managing fixed size memory blocks in a system memory containing queues of memory blocks of fixed sizes and a page pool of memory blocks of variable sizes, the method comprising the steps of:

requesting a memory block of a particular fixed size for processing data;

determining if a queue of memory blocks of said fixed size has at least one memory block of said fixed size available; and if said queue has at least one memory block of said fixed size available, allocating said at least one memory block; or if said queue does not have at least one memory block of said fixed size available, determining if the page pool has a memory block available; and creating an extension to said queue from the page pool and allocating a memory block of said fixed size from said queue if said page pool has a memory block available; or deallocating at least one allocated memory block in said queue and allocating a memory block of said fixed size from said queue if said page pool does not have a memory block available.

2. The method of claim 1, further comprising the steps of:

determining whether an end of data to be processed has been reached; and deallocating all allocated memory blocks if the end of the data to be processed has been reached.

3. The method of claim 1, wherein said step of creating extensions comprises the steps of:

selecting a memory block from said page pool;

dividing said selected memory block into fixed size memory blocks of said fixed size;

linking said divided memory block to said queue; and updating system parameters to indicate a new extension has been created.

4. The method of claim 1, further comprising a step of updating system parameters indicating that a block has been allocated.

5. The method of claim 4, wherein said step of updating system parameters comprises the steps of:

determining whether an extension has been created; and updating a usage count of blocks allocated from the extension if an extension has been created.

6. The method of claim 1, wherein said step of deallocating comprises the steps of:

freeing an allocated block;

determining whether said freed block was allocated from an extension;

returning said freed block to said queue if said freed block was not allocated from an extension;

locating said extension, returning said freed block to said extension, and determining whether all blocks from said extension have been freed if said freed block was allocated from an extension;

returning said extension to said page pool if all the blocks from said extension have been freed; and repeatedly freeing allocated blocks until all allocated blocks have been freed.

7. The method of claim 6, wherein the step of returning said extension to said page pool comprises the steps of:

unlinking said extension from said queue;

combining divided blocks of said fixed size into a variable size memory block;

returning said variable size memory block to said page pool; and updating system parameters to indicate that an extension has been returned to the pool.

8. The method of claim 1, wherein said step of requesting a memory block is performed by an interpreter and said memory block is allocated for storing a display list representation in a printer.

9. The method of claim 8, wherein said step of deallocating includes rendering display list representations stored in allocated memory blocks into a frame buffer.

10. A system for managing memory blocks for processing data in response to requests, comprising:

a system memory containing queues of fixed size memory blocks and a page pool of variable size memory blocks; and a system memory manager for allocating memory blocks from said system memory, wherein, upon a request for a memory block of a particular fixed size, said system memory manager determines if a queue of memory blocks of said fixed size has at least one memory block of said fixed size available and allocates said at least one memory block if said queue has said at least one memory block of said fixed size available, or if said queue does not have at least one memory block of said fixed size available, determines if the page pool has a memory block available and creates an extension to said queue from the page pool and allocates a memory block of said fixed size from said extension if said page pool has a memory block available, or deallocates all allocated memory blocks and allocates a memory block of said fixed size from deallocated memory blocks in said queue if said page pool does not have a memory block available.

11. The system of claim 10, wherein the system memory manager determines whether an end of the data to be processed has been reached and deallocates all allocated memory blocks if the end of the data to be processed has been reached.

12. The system of claim 10, wherein said system memory manager creates said extensions by:

selecting a memory block from said page pool;

dividing said selected memory block into fixed size memory blocks of said fixed size;

linking said divided memory block to said queue; and updating system parameters to indicate a new extension has been created.

13. The system of claim 12, wherein the system memory manager updates system parameters indicating that a block has been allocated.

14. The system of claim 13, wherein the system memory manager updates said system parameters by:

determining whether an extension has been created; and if an extension has been created, updating a usage count of the blocks allocated from the extension.

15. The system of claim 12, wherein the system memory manager deallocates said allocated blocks by:

freeing an allocated block;

determining whether said freed block was allocated from an extension;

returning said freed block to said queue if said freed block was not allocated from an extension;

locating said extension, returning said freed block to said extension, and determining whether all blocks from said extension have been freed if said freed block was allocated from an extension;

returning said extension to said page pool if all the blocks from said extension have been freed; and repeatedly freeing allocated blocks until all allocated blocks have been freed.

16. The system of claim 15, wherein the system memory manager returns said extension to said page pool by:

unlinking said extension from said queue;

combining divided blocks of said fixed size into a variable size memory block;

returning said variable size memory block to said page pool; and updating system parameters to indicate that an extension has been returned to the pool.

17. The system of claim 12, further comprising an interpreter for issuing said request for a memory block, wherein said memory block is allocated for storing a display list representation.

18. The system of claim 17, wherein said system memory manager deallocates said allocated memory blocks by rendering display list representations stored in said allocated memory blocks into a frame buffer.

19. A graphic imaging system comprising:

processing means for processing image data;

a system memory including queues of fixed size memory blocks and a page pool of variable size memory blocks;

a system memory manager for managing memory blocks in said system memory for processing by the processing means, wherein said system memory manager allocates memory blocks from said queues, creates extensions for said queues from said page pool, allocates memory blocks from said extensions and deallocates memory blocks if there are no variable size memory blocks of the page pool available to create an extension.

20. A method of managing fixed size memory blocks in a system memory containing queues of memory blocks of fixed sizes and a page pool of memory blocks of variable sizes, the method comprising the steps of:

requesting a memory block of a particular fixed size for processing data;

determining if a queue of memory blocks of said fixed size has at least one memory block of said fixed size available; and if said queue has at least one memory block of said fixed size available, allocating said at least one memory block; or if said queue does not have at least one memory block of said fixed size available, determining if the page pool has a memory block available; and creating an extension to said queue from the page pool and allocating a memory block of said fixed size from said queue if said page pool has a memory block available; or deallocating at least one allocated memory block in said queue and allocating a memory block of said fixed size from said queue in response to said request, if said page pool does not have a memory block available; otherwise deallocating all data blocks after all said data has been allocated to memory.

21. A method of deallocating fixed size memory blocks in a system memory containing queues of memory blocks of fixed sizes and a page pool of memory blocks of variable sizes, to enable a predetermined amount of data to be stored, the method comprising the steps of:

allocating fixed size memory blocks from a queue using either said queue of memory blocks or said memory blocks in said page pool;

deallocating at least one allocated memory block in said queue and allocating a memory block of said fixed size from said queue in response to a request for memory if said queue does not have at least one memory block of said fixed size available, and said page pool does not have a memory block available; otherwise deallocating all data blocks after all said data has been allocated to memory.

22. A method for allocating memory for processing a predetermined amount of data, comprising the steps of:

receiving a request for a block of memory for storing data to be processed;

determining whether a queue of memory blocks has at least one unallocated block of available memory;

allocating a block of memory from said queue and storing said data in the allocated block of memory when said queue is determined to have an available block of memory;

determining whether a page pool of memory blocks has at least one unallocated block of available memory when said queue is determined not to have an available block of memory;

creating an extension to said queue, from memory in the page pool, when the page pool is determined to have available memory, and allocating a block of memory from said extension to store said data;

processing the data stored in the blocks of memory allocated from said queue, prior to storing the entire predetermined amount of data in allocated memory, when the page pool is determined not to have available memory; and deallocating the blocks of memory in which the processed data was stored, to thereby free the blocks of memory for allocation in response to the received request.

23. A method for allocating memory for the processing of data which describes an image to be printed, comprising the steps of:

receiving a request for a block of memory for storing data relating to the image;

determining whether a queue of memory blocks has at least one unallocated block of available memory;

allocating a block of memory from said queue and storing said data relating to the image in the allocated block of memory when said queue is determined to have an available block of memory;

determining whether a page pool of memory blocks has at least one unallocated block of available memory when said queue is determined not to have an available block of memory;

creating an extension to said queue, from memory in the page pool, when the page pool is determined to have available memory, and allocating a block of memory from said extension to store said data relating to the image;

rendering the data stored in the blocks of memory allocated from said queue when the page pool is determined not to have available memory; and deallocating the blocks of memory in which the rendered data was stored, to thereby free the blocks of memory for allocation in response to the received request.

* * * * *